(12) United States Patent
Hu et al.

(10) Patent No.: US 12,230,642 B2
(45) Date of Patent: Feb. 18, 2025

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventors: Zemin Hu, Hubei (CN); Chao Wang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/756,043

(22) PCT Filed: Apr. 24, 2022

(86) PCT No.: PCT/CN2022/088829
§ 371 (c)(1),
(2) Date: May 14, 2022

(87) PCT Pub. No.: WO2023/197369
PCT Pub. Date: Oct. 19, 2023

(65) Prior Publication Data
US 2024/0153961 A1    May 9, 2024

(30) Foreign Application Priority Data
Apr. 14, 2022  (CN) .......................... 202210393502.X

(51) Int. Cl.
*H01L 29/786* (2006.01)
*G02F 1/1362* (2006.01)
*H01L 27/12* (2006.01)

(52) U.S. Cl.
CPC ...... *H01L 27/124* (2013.01); *G02F 1/136227* (2013.01); *G02F 1/136209* (2013.01); *G02F 1/136286* (2013.01); *H01L 29/78633* (2013.01)

(58) Field of Classification Search
None
See application file for complete search history.

(56) References Cited

U.S. PATENT DOCUMENTS

2009/0159887 A1   6/2009  Huh et al.
2017/0294464 A1*  10/2017 Kwon ................. G02F 1/13624
2020/0303425 A1*  9/2020  Hara ...................... H01L 27/127

FOREIGN PATENT DOCUMENTS

| CN | 1932591 A | 3/2007 |
| CN | 104217994 A | 12/2014 |

(Continued)

OTHER PUBLICATIONS

International Search Report in International application No. PCT/CN2022/088829, mailed on Dec. 16, 2022.

(Continued)

*Primary Examiner* — Richard H Kim
(74) *Attorney, Agent, or Firm* — PV IP PC; Wei Te Chung

(57) ABSTRACT

A display panel and a display device are provided. The display panel includes a substrate, a first metal layer disposed on a side of the substrate, a second metal layer disposed on a side of the first metal layer away from the substrate and including a plurality of gate electrodes and a plurality of sets of source and drain electrodes arranged in the same layer as the gate electrodes, and a plurality of data lines. Each of the data lines is disposed in the same layer as the first metal layer and is electrically connected to the source and drain electrodes.

20 Claims, 9 Drawing Sheets

(56) References Cited

FOREIGN PATENT DOCUMENTS

| | | |
|---|---|---|
| CN | 111029343 A | 4/2020 |
| CN | 111628003 A | 9/2020 |
| CN | 111769123 A | 10/2020 |

OTHER PUBLICATIONS

Written Opinion of the International Search Authority in International application No. PCT/CN2022/088829, mailed on Dec. 16, 2022.

* cited by examiner

DISPLAY PANEL AND DISPLAY DEVICE

BACKGROUND OF INVENTION

1. Field of Invention

The present application relates to a technical field of displays, and particularly to a display panel and a display device.

2. Related Art

In recent years, in order to pursue better display performance, high pixel density has been continuously pursued, whereas high pixel density has resulted in an increase in metal line density. Under limitations of processes, the increase in the metal line density generally increases number of metal film layers by overlapping different film layers on top of each other. However, such a method will increase number of masks and processes. As a result, for high pixel density display panels, how to reduce the number of processes and masks is particularly important.

Therefore, it is imperative to provide a display panel and a display device to solve the above-mentioned technical problem.

SUMMARY OF INVENTION

An object of the present invention is to provide a display panel and a display device, which can alleviate a technical problem of number of processes and masks used in current display panels.

In order to achieve the above-mentioned object, the present application provides a technical solution as follows:

An embodiment of the present application provides a display panel, including a substrate; a first metal layer disposed on a side of the substrate; a second metal layer disposed on a side of the first metal layer away from the substrate and comprising a plurality of gate electrodes and a plurality of sets of source and drain electrodes arranged in the same layer as the gate electrodes; and a plurality of data lines, wherein each of the data lines is disposed in the same layer as the first metal layer and is electrically connected to the source and drain electrodes.

Preferably, an orthographic projection of each of the data lines on the substrate is located outside an orthographic projection of the active layer on the substrate.

Preferably, the display panel further includes a buffer layer located between the active layer and the first metal layer, and an interlayer dielectric layer located between the buffer layer and the second metal layer metal layer. The interlayer dielectric layer includes a plurality of first via holes and a plurality of second via holes, the buffer layer includes a plurality of third via holes, and each set of the source and drain electrodes including the source electrode disposed opposite to the drain electrode. Each of the first via holes is located extending through a corresponding one of the third via holes, each of the source electrodes is electrically connected to the data line through the first via hole and the third via hole, and the source electrode is electrically connected to the active layer through the second via hole. An extending direction of a connection line defined between the first via hole and the second via hole corresponding to a same source electrode is parallel to an extending direction of the data line.

Preferably, each of the data lines includes a first segment and a second segment located parallel to each other, an orthographic projection of the active layer on the first metal layer is located on an extending line of the first segment and is positioned outside an extending line of the second segment, and the source electrode is electrically connected to a corresponding one of the first segments.

Preferably, the interlayer dielectric layer further includes a plurality of fourth via holes, and the drain electrodes are electrically connected to the active layer through the fourth via holes. The display panel further includes a pixel electrode layer located on a side of the second metal layer away from the substrate, and a planarization layer located between the pixel electrode layer and the second metal layer. The planarization layer includes a plurality of fifth via holes, and the pixel electrode layer is electrically connected to the drain electrodes through the fifth via holes.

Preferably, the active layer includes a channel region, a heavily doped region, and a lightly doped region disposed between the channel region and the heavily doped region. The gate electrode is disposed corresponding to the channel region, the source electrode is correspondingly connected to the heavily doped region through the second via hole, and the drain electrode is correspondingly connected to the heavily doped region through the fourth via hole.

Preferably, an orthographic projection of the fifth via hole on the substrate is located within an orthographic projection of the drain electrode on the substrate, and the orthographic projection of the fifth hole on the substrate is located outside the orthographic projection of the active layer on the substrate.

Preferably, the first metal layer includes a plurality of light-shielding units spaced apart from any one of the data lines and disposed in the same layer as the data lines, and an orthographic projection of the active layer on the first metal layer is located within a corresponding one of the light-shielding units.

Preferably, the second metal layer further includes a plurality of scan lines arranged in a first direction, any one of the data lines is arranged in a second direction, and the first direction is perpendicular to the second direction.

Preferably, the first metal layer further includes a light-reflecting unit located between adjacent ones of the data lines and is spaced apart from any one of the data lines.

An embodiment of the present application further provides a display device, including a display panel and a device body assembled together into one body, and the display panel includes a substrate; a first metal layer disposed on a side of the substrate; a second metal layer disposed on a side of the first metal layer away from the substrate and comprising a plurality of gate electrodes and a plurality of sets of source and drain electrodes arranged in the same layer as the gate electrodes; and a plurality of data lines, wherein each of the data lines is disposed in the same layer as the first metal layer and is electrically connected to the source and drain electrodes.

Preferably, an orthographic projection of each of the data lines on the substrate is located outside an orthographic projection of the active layer on the substrate.

Preferably, the display panel further includes a buffer layer located between the active layer and the first metal layer, and an interlayer dielectric layer located between the buffer layer and the second metal layer metal layer. The interlayer dielectric layer includes a plurality of first via holes and a plurality of second via holes, the buffer layer includes a plurality of third via holes, and each set of the source and drain electrodes including the source electrode disposed opposite to the drain electrode. Each of the first via holes is located extending through a corresponding one of the third via holes, each of the source electrodes is electrically connected to the data line through the first via hole and the third via hole, and the source electrode is electrically connected to the active layer through the second via hole. An extending direction of a connection line defined between the first via hole and the second via hole corresponding to a same source electrode is parallel to an extending direction of the data line.

Preferably, each of the data lines includes a first segment and a second segment located parallel to each other, an orthographic projection of the active layer on the first metal layer is located on an extending line of the first segment and is positioned outside an extending line of the second segment, and the source electrode is electrically connected to a corresponding one of the first segments.

Preferably, the interlayer dielectric layer further includes a plurality of fourth via holes, and the drain electrodes are electrically connected to the active layer through the fourth via holes. The display panel further includes a pixel electrode layer located on a side of the second metal layer away from the substrate, and a planarization layer located between the pixel electrode layer and the second metal layer. The planarization layer includes a plurality of fifth via holes, and the pixel electrode layer is electrically connected to the drain electrodes through the fifth via holes.

Preferably, the active layer includes a channel region, a heavily doped region, and a lightly doped region disposed between the channel region and the heavily doped region. The gate electrode is disposed corresponding to the channel region, the source electrode is correspondingly connected to the heavily doped region through the second via hole, and the drain electrode is correspondingly connected to the heavily doped region through the fourth via hole.

Preferably, an orthographic projection of the fifth via hole on the substrate is located within an orthographic projection of the drain electrode on the substrate, and the orthographic projection of the fifth hole on the substrate is located outside the orthographic projection of the active layer on the substrate.

Preferably, the first metal layer includes a plurality of light-shielding units spaced apart from any one of the data lines and disposed in the same layer as the data lines, and an orthographic projection of the active layer on the first metal layer is located within a corresponding one of the light-shielding units.

Preferably, the second metal layer further includes a plurality of scan lines arranged in a first direction, any one of the data lines is arranged in a second direction, and the first direction is perpendicular to the second direction.

Preferably, the first metal layer further includes a light-reflecting unit located between adjacent ones of the data lines and is spaced apart from any one of the data lines.

The present application has advantageous effects as follows: in this invention, by disposing the gate electrodes and the source and drain electrodes in the same layer, and the data lines and the first metal layer in the same layer, and by using the first metal layer for the wiring arrangement of the data lines, film thickness is reduced, along with formation of the gate electrodes and the source and drain electrodes through one mask process, which reduces number of processes and masks, improves production efficiency, increase a display aperture ratio, and enhances display performance.

Figure 1:
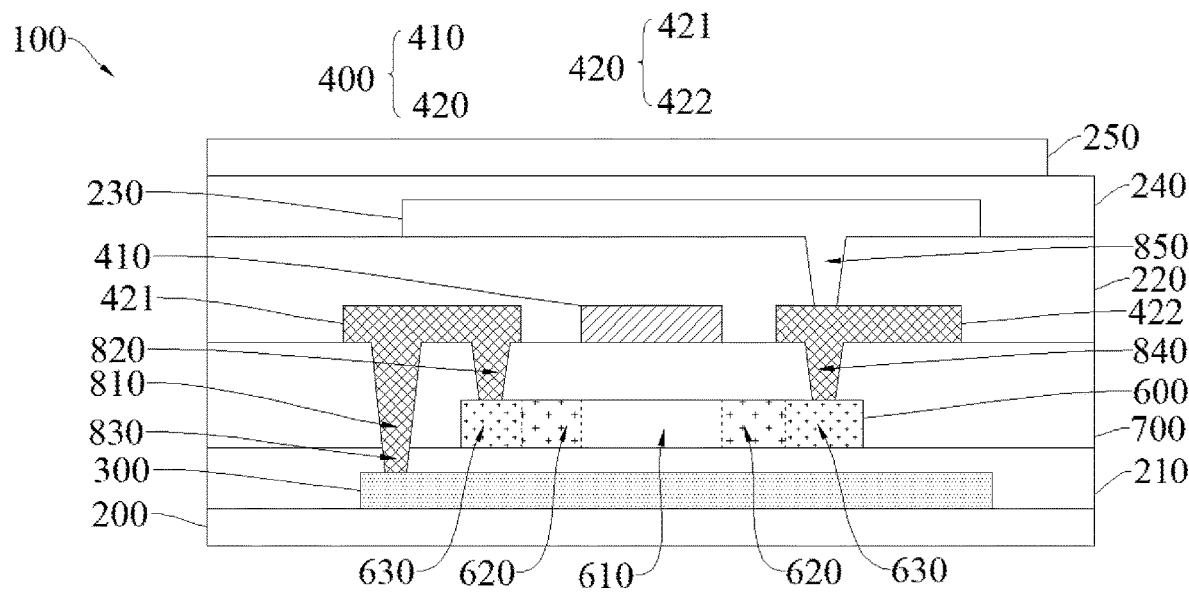
FIG. 1 is a schematic structural view of a first type of structure of a display panel according to an embodiment of the present invention.

DESCRIPTION OF PREFERRED
EMBODIMENTS

The present application provides a display panel and a display device. In order to make the objectives, technical solutions, and effects of the present application clearer, the present application will be further described in detail below with reference to the accompanying drawings and embodiments. It should be understood that the specific embodiments described here are only used to illustrate the present application, and are not used to limit the present application.

Embodiments of the present application provide a display panel and a display device. Detailed descriptions are given below. It should be noted that the description order of the following embodiments is not intended to limit the preferred order of the embodiments.

Please refer to FIGS. 1 to 7, embodiments of the present application provides a display panel 100, including a substrate 200, a first metal layer 300 disposed on a side of the substrate 200, a second metal layer 400 disposed on a side of the first metal layer 300 away from the substrate 200 and including a plurality of gate electrodes 410 and a plurality of sets of source and drain electrodes 420 arranged in the same layer as the gate electrodes 410, and a plurality of data lines 500, wherein each of the data lines 500 is disposed in the same layer as the first metal layer 300, and the data lines 500 are electrically connected to the source and drain electrodes 420, respectively.

In this invention, by disposing the gate electrodes and the source and drain electrodes in the same layer, and the data lines and the first metal layer in the same layer, and by using the first metal layer for a wiring arrangement of the data lines, film thickness is reduced, along with formation of the gate electrodes and the source and drain electrodes through one mask process, which reduces number of processes and masks, improves production efficiency, increase a display aperture ratio, and enhances display performance.

The technical solutions of the present invention will now be described with reference to specific embodiments.

Figure 3:
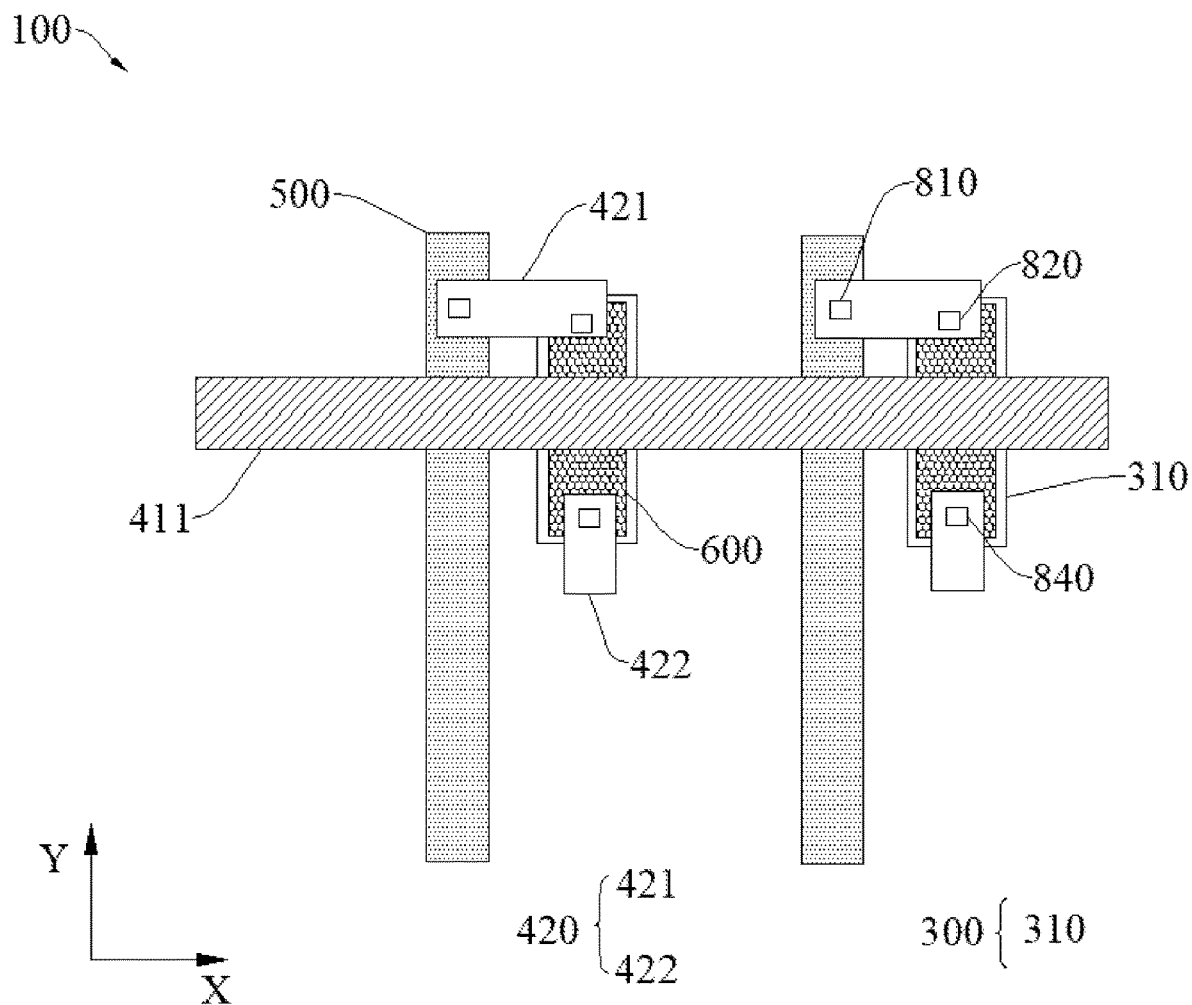
FIG. 3 is a schematic structural view of a third type of structure of a display panel according to an embodiment of the present invention.
Figure 4:
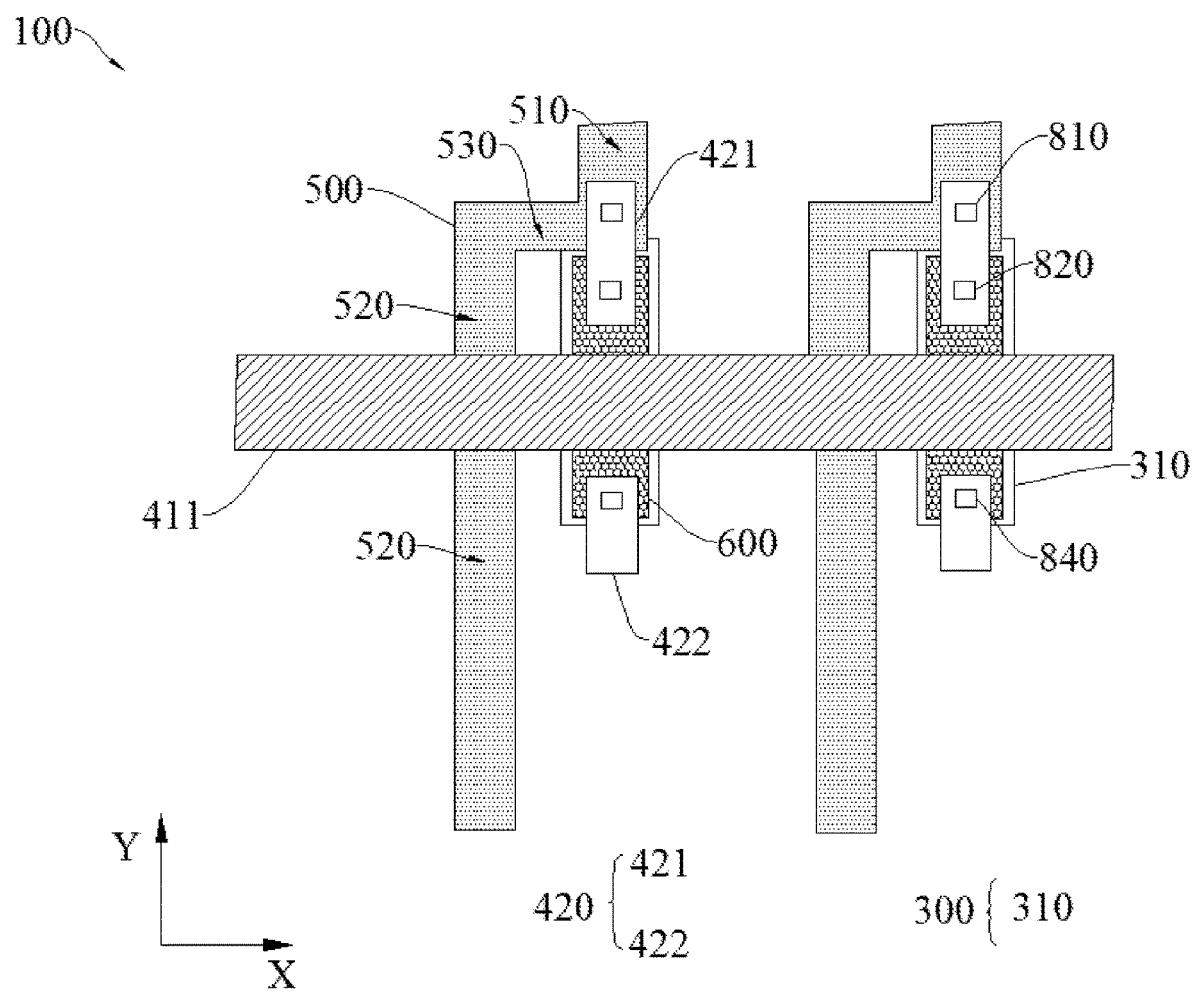
FIG. 4 is a schematic structural view of a fourth type of structure of a display panel according to an embodiment of the present invention.
Figure 6:
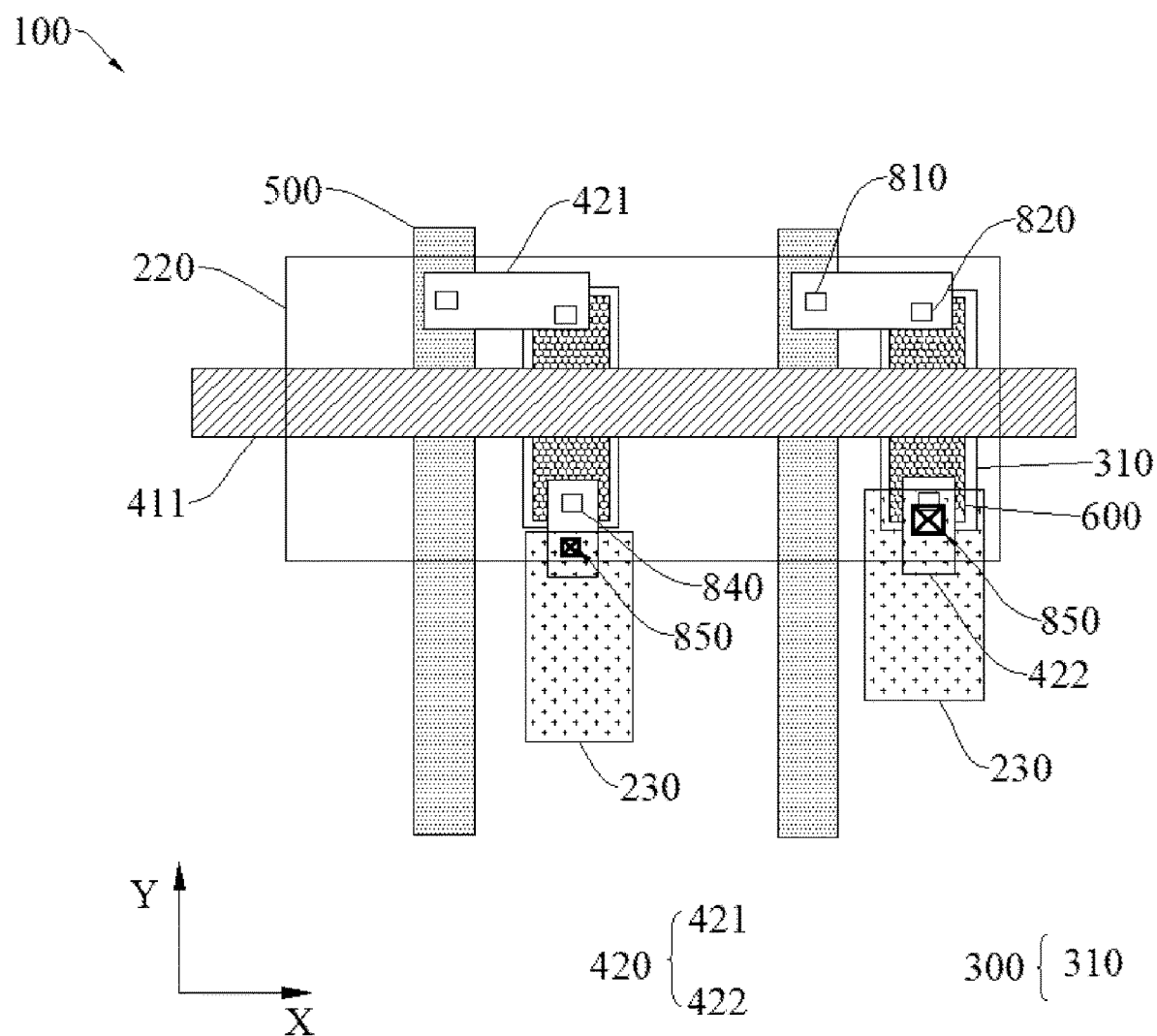
FIG. 6 is a schematic structural view of a sixth type of structure of a display panel according to an embodiment of the present invention.

In this embodiment, please refer to FIG. 1, FIG. 3, and FIG. 6, the display panel 100 includes a substrate 200, a first metal layer 300 located on one side of the substrate 200, and a first metal layer 300 located on one side of the substrate 200. The second metal layer 400 on the side of the first metal layer 300 away from the substrate 200, the second metal layer 400 includes a plurality of gate 410 and a plurality of groups of sources arranged in the same layer The drain 420, wherein the display panel 100 further includes a plurality of data lines 500, any of the data lines 500 and the first metal layer 300 are disposed in the same layer, and the data lines 500 are electrically connected to the source and drain 420. connect.

The gate electrodes 410 and the source and drain electrodes 420 can be formed at a same time through one mask process, and a wiring of the data lines 500 is arranged on a side of the second metal layer 400 close to the substrate 200 in the first metal layer 300. The first metal layer 300 is configured for a wiring arrangement of the data lines 500, and the data lines 500 and the source and drain electrodes 420 are bridged by the second metal layer 400. In this way, it can reduce film thickness as well as number of processes and masks, thus improving production efficiency, increasing a display aperture ratio, and enhancing display performance.

In some embodiments, referring to FIGS. 3 to 7, the display panel 100 further includes an active layer 600 located between the second metal layer 400 and the first metal layer 300, wherein an orthographic projection of any one of the data lines 500 on the substrate 200 is located outside an orthographic projection of the active layer 600 on the substrate 200.

In order to reduce influence of signals of the data line 500 on the active layer 600, the data line 500 needs to avoid the active layer 600. In a top view direction, the data line 500 and the active layer 600 do not coincide, which can reduce the influence of the data lines 500 on the active layer 600, thereby improving the display performance of the display panel 100.

In some embodiments, please refer to FIGS. 1, 3, and 6. The display panel 100 further includes a buffer layer 210 located between the active layer 600 and the first metal layer 300, and an interlayer dielectric layer 700 located between the active layer 600 and the second metal layer 400. The interlayer dielectric layer 700 includes a plurality of first via holes 810 and a plurality of second via holes 820, the buffer layer 210 includes a plurality of third via holes 830, and each set of the source and drain electrodes 420 includes a source electrode 421 and a drain electrode 422 arranged opposite to each other. Each of the first via holes 810 is formed extending through a corresponding one of the third via holes 830, the source electrode 421 is electrically connected to the data line 500 through the first via hole 810 and the third via hole 830, and the source electrode 421 is electrically connected to the active layer 600 through the second via hole 820. Specifically, an extending direction of a connection line defined between the first via hole 810 and the second via hole 820 corresponding to a same source electrode 421 is parallel to an extending direction of the data line 500.

Each of the gate electrodes 410 is changed to the first metal layer 300 and the active layer 600 through the first via hole 810 and the second via hole 820, respectively, and the data lines 500 are arranged in a first direction, which is a Y-axis direction shown in the drawings. A scan line 411 configured to connect to the gate electrode is arranged in a second direction, which is an X-axis direction. An arrangement direction in which a wire changing portion for the wiring change of the gate electrode 410 is oriented is parallel to an extending direction of the data line 500, which can save an arrangement space in the second direction, and is conducive to arranging more pixels and wirings and improving display pixel density of the display panel 100.

In some embodiments, referring to FIGS. 4 to 7, each of the data lines 500 includes a first segment 510 and a second segment 520 located parallel to each other. Specifically, an orthographic projection of the active layer 600 on the first metal layer 300 is located on an extending line of the first segment 510 and is positioned outside an extending line of the second segment 520, and the source electrode 421 is electrically connected to a corresponding one of the first segments 510.

The source electrode 421 is electrically connected to the first segment 510, so that conduction between the source electrode 421 and the data line 500 can be realized. From the first segment 510 to the second segment 520, the data line 500 is routed to avoid the active layer 600 corresponding to the source and drain electrodes 420, so as to prevent the influence of the data line 500 on the active layer 600 as well as facilitating arrangement of the wire changing portion in the first direction, thereby saving the arrangement space in the second direction, which is conducive to arranging more pixels and wirings and improving the display pixel density of the display panel 100.

Figure 5:
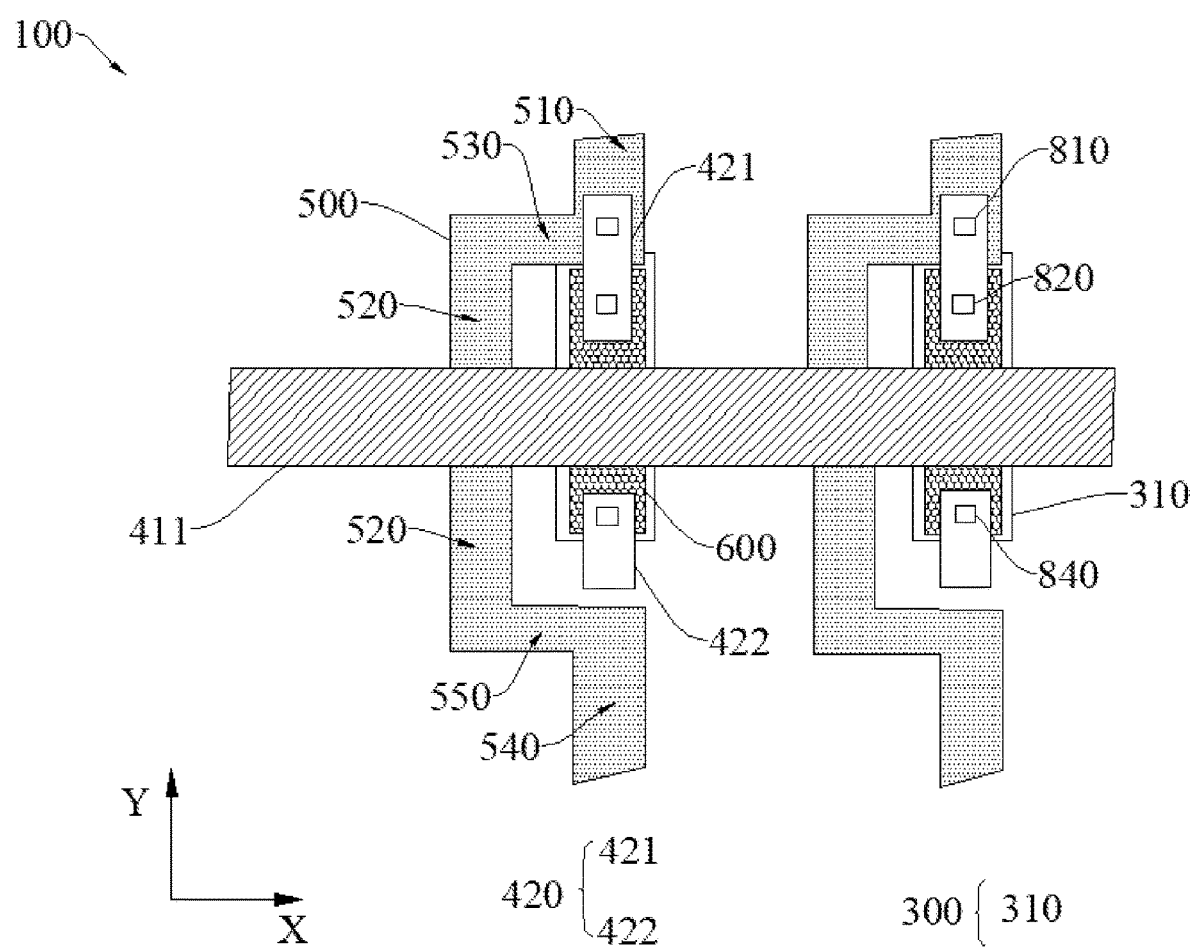
FIG. 5 is a schematic structural view of a fifth type of structure of a display panel according to an embodiment of the present invention.
Figure 7:
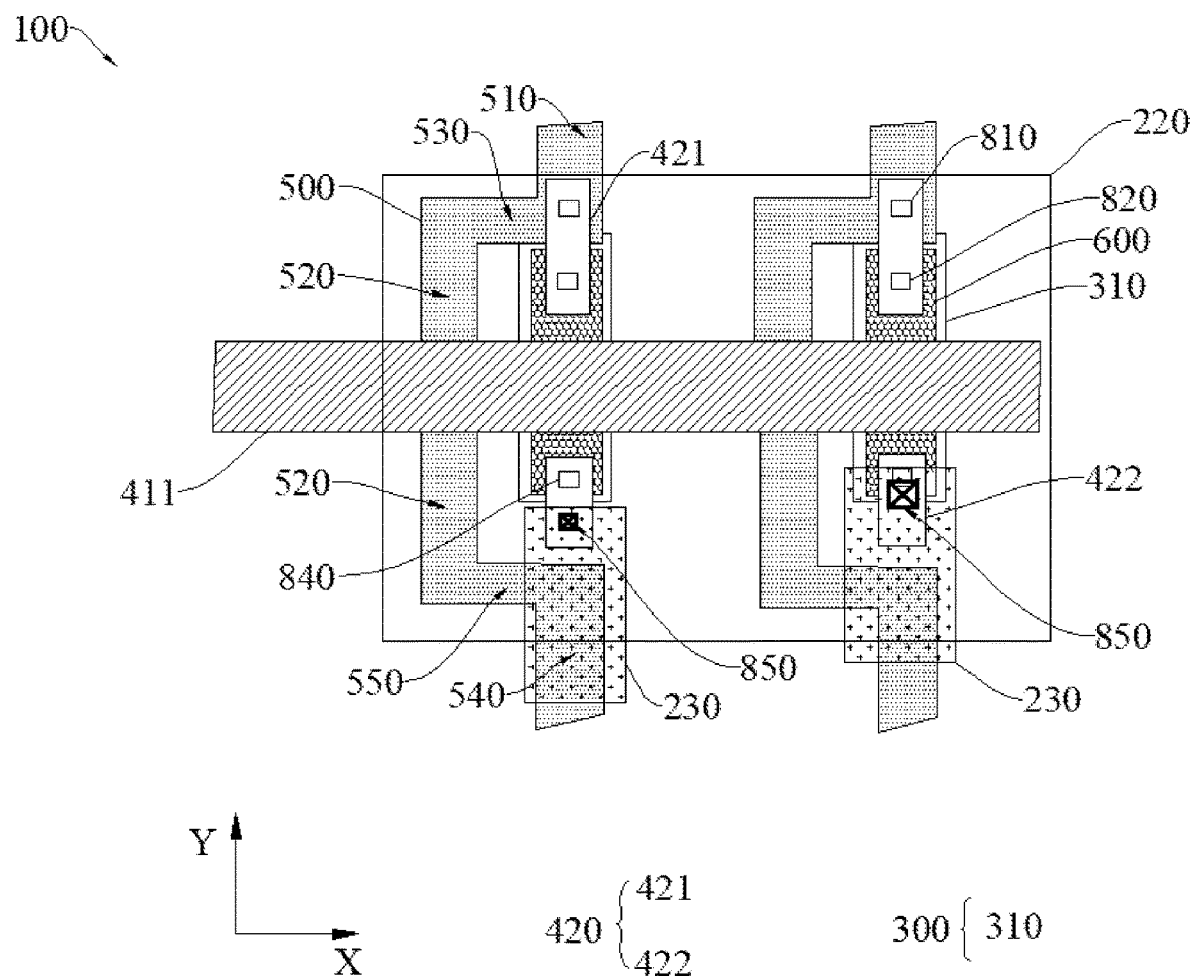
FIG. 7 is a schematic structural view of a seventh type of structure of a display panel according to an embodiment of the present invention.

In some embodiments, referring to FIGS. 5 and 7, the data line 500 further includes a third segment 530 connecting the first segment 510 and the second segment 520, and a fourth segment 540 parallel to the first segment 510, and a fifth segment 550 connecting the second segment 520 and the fourth segment 540. The third segment 530 may be perpendicular to the first segment 510, and the fifth segment 550 may be perpendicular to the fourth segment 540.

The data line 500 is routed to avoid the active layer 600, so as to prevent the influence of the data line 500 on the active layer 600 and further facilitate the arrangement of the wire changing portion in the first direction, thereby saving the arrangement space in the second direction, which is conducive to arranging more pixels and wirings and improving the display pixel density of the display panel 100.

In some embodiments, please refer to FIGS. 1, 6, and 7. The interlayer dielectric layer 700 further includes a plurality of fourth via holes 840, and the drain electrode 422 is electrically connected to the active layer 600 through the fourth via hole 840. The display panel 100 further includes a pixel electrode layer 230 located on a side of the second metal layer 400 away from the substrate 200, and a planarization layer 220 located between the pixel electrode layer 230 and the second metal layer 400. Specifically, the planarization layer 220 includes a plurality of fifth via holes 850, and the pixel electrode layer 230 is electrically connected to the drain electrodes 422 through the fifth via holes 850.

Specifically, in FIGS. 6 and 7, shape and coverage are allowed for formation of the electrode layer 230 and the planarization layer 220. Specific shapes and coverage areas in the drawings are only for convenience and clarity, and do not make specific limitations. The source electrode 421 and the drain electrode 422 of the second metal layer 400 can be electrically connected to the active layer 600 through holes formed by patterning the interlayer insulating layer 700. In addition, the pixel electrode layer 230 can be electrically connected to the drain electrode 422 by patterning holes in the planarization layer 220, and the drain electrode 422 transmits signals to the pixel electrode layer 230 to achieve display.

Figure 2:
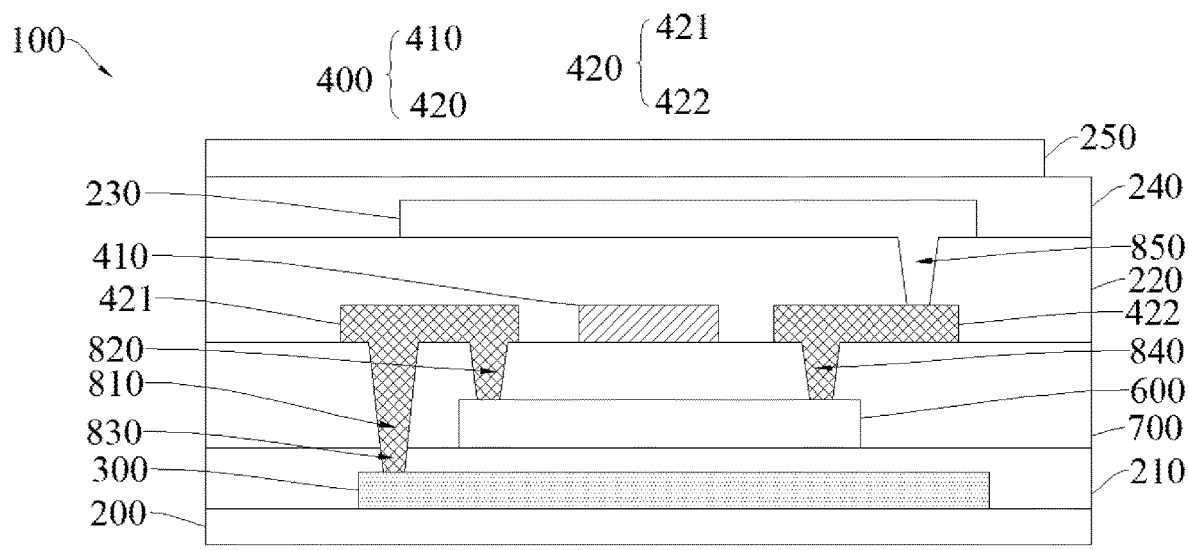
FIG. 2 is a schematic structural view of a second type of structure of a display panel according to an embodiment of the present invention.

In some embodiments, referring to FIGS. 2 and 6, an orthographic projection of the fifth via hole 850 on the substrate 200 is located within an orthographic projection of the drain electrode 422 on the substrate 200, and the orthographic projection of the fifth hole 850 on the substrate 200 is located outside the orthographic projection of the active layer 600 on the substrate 200.

Specifically, FIG. 6 shows two types of relationships between the fifth via hole 850 and the active layer 600. Since a thickness of the planarization layer 220 is relatively thick, if the fifth via hole 850 is small in size, it tends to cause the pixel electrode layer 230 to be broken in the fifth via hole 850. Therefore, the drain electrode 422 is extended in a direction away from a center of the corresponding active layer 600, the fifth via hole 850 and the fourth via hole 840 are separate from each other, which facilitates an increase in the size of the fifth via hole 850, so that the connection between the pixel electrode layer 230 and the drain electrode 422 is more stable, and the display performance is improved.

In some embodiments, referring to FIG. 1, the active layer 600 includes a channel region 610, a heavily doped region 630, and a lightly doped region 620 disposed between the channel region 610 and the heavily doped region 630. Specifically, the gate electrode 410 is disposed corresponding to the channel region 610, the source electrode 421 is correspondingly connected to the heavily doped region 630 through the second via hole 820, and the drain electrode 422 is correspondingly connected to the heavily doped region 630 through the fourth via hole 840.

The gate electrode 410, the source electrode 421, and the drain electrode 422 disposed in the same layer correspond to different regions of the active layer 600. The gate electrode 410 is located corresponding to the channel region 610. The source electrode 421 is correspondingly connected to the heavily doped region 630 through the second via hole 820, and the drain electrode 422 is connected to the heavily doped region 630 through the fourth via hole 840. The gate electrode 410 can implement switching on the channel region 610 of the active layer 600. Each of the source electrode 421 and the drain electrode 422 is connected to the heavily doped region 630 that is beneficial to improve semiconductor performance of the active layer 600.

In some embodiments, the doping of the active layer 600 may be N-type doping, the heavily doped region 630 may be represented by N+, and the lightly doped region 620 may be represented by N−.

In some embodiments, please refer to FIGS. 3 to 7. The first metal layer 300 includes a plurality of light-shielding units 310 spaced apart from any of the data lines 500 and disposed in the same layer as the data lines 500. Specifically, an orthographic projection of the active layer 600 on the first metal layer 300 is located within a corresponding one of the light-shielding units 310.

The first metal layer 300 further includes a light-shielding unit 310 for shielding light directed to the active layer 600 to reduce photoelectric influence of the light on the active layer 600. Furthermore, the light-shielding unit 310 is spaced apart from any of the data lines 500 and is insulated from the data line 500 to reduce the influence of the data lines 500 on the signal of the light-shielding unit 310.

In some embodiments, the first metal layer 300 further includes a light-reflecting unit located between adjacent ones of the data lines 500 and is spaced apart from any of the data lines 500.

When the display panel 100 is a self-luminous display panel 100, the light-reflecting unit can reflect light emitted in a direction from the first metal layer 300 away from the substrate 200 toward the first metal layer 300, so as to improve light extraction efficiency of the display panel 100.

In some embodiments, please refer to FIGS. 3 to 7. The second metal layer 400 further includes a plurality of scan lines 411 arranged in the first direction. Each of the data lines 500 is arranged in the second direction, and the first direction is perpendicular to the second direction.

The scan lines 411 and the data lines 500 are disposed horizontally and vertically in staggered relationship to each other, and the data lines 500 are electrically connected to the gate electrodes 410 to provide signals for the gate electrodes 410.

In some embodiments, the display panel 100 may be a liquid crystal display panel 100 or a self-luminous display panel 100.

In some embodiments, the display panel 100 is a liquid crystal display panel 100 and further includes a passivation layer 240 disposed on the pixel electrode layer 230 and a common electrode layer 250 disposed on the passivation layer 240. In FIGS. 1 and 2, the display panel 100 is taken only as the liquid crystal display panel 100 as an example for description.

The display panel 100 further includes a liquid crystal layer, a color filter layer, and upper and lower polarizing layers.

In some embodiments, the display panel 100 is a self-luminous display panel 100 and further includes a light-emitting device layer disposed on the pixel electrode layer 230.

In some embodiments, the light-emitting device layer includes the pixel electrode layer 230 disposed above the interlayer dielectric layer, a light-emitting material layer disposed on the pixel electrode layer 230, and a cathode layer disposed on the light-emitting material layer. The display panel 100 further includes a pixel definition layer disposed in the same layer as the light-emitting material layer, a polarizing layer disposed on the light-emitting device layer, and a flexible cover disposed on the polarizing layer. The display panel 100 further includes bonding layers located between the polarizing layer and the flexible cover, between the light-emitting device layer and the polarizing layer, and between a backplate and the substrate 200, respectively.

In some embodiments, the light-emitting device layer may include an organic light-emitting diode (OLED) material, organic light-emitting semiconductor), or may include a micro light-emitting diode (LED) or mini LED, which is not specifically limited here.

In some embodiments, the first metal layer 300 and the second metal layer 400 may be a single metal layer or a stacked metal layer, which is not specifically limited herein.

In this invention, by disposing the gate electrodes and the source and drain electrodes in the same layer, and the data lines and the first metal layer in the same layer, and by using the first metal layer for the wiring arrangement of the data lines, film thickness is reduced, along with formation of the gate electrodes and the source and drain electrodes through one mask process, which reduces number of processes and masks, improves production efficiency, increase a display aperture ratio, and enhances display performance.

Figure 8:
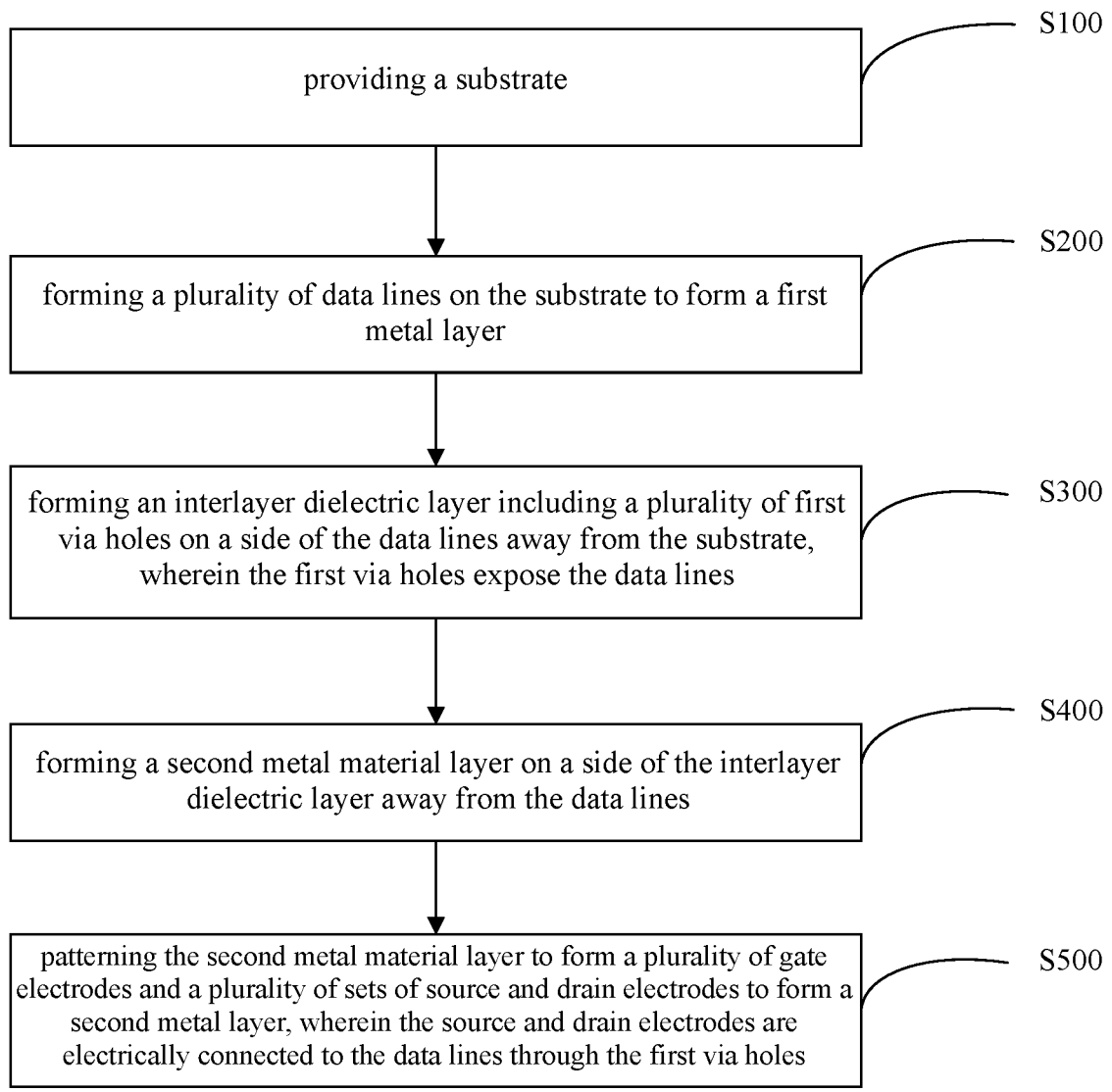
FIG. 8 is a flowchart of a method of manufacturing a display panel according to an embodiment of the present invention.

Please refer to FIG. 8, an embodiment of the present application further provides a display panel 100, including:
  Step S100: providing a substrate 200;
  Step S200: forming a plurality of data lines 500 on the substrate 200 to form a first metal layer 300;
  Step S300: forming an interlayer dielectric layer 700 including a plurality of first via holes 810 on a side of the data lines 500 away from the substrate 200, wherein the first via holes 810 expose the data lines 500;

Step S400: forming a second metal material layer 401 on a side of the interlayer dielectric layer 700 away from the data lines 500; and Step S500: patterning the second metal material layer 401 to form a plurality of gate electrodes 410 and a plurality of sets of source and drain electrodes 420 to form a second metal layer 400, wherein the source and drain electrodes 420 are electrically connected to the data lines 500 through the first via holes 810.

In this invention, by disposing the gate electrodes and the source and drain electrodes in the same layer, and the data lines and the first metal layer in the same layer, and by using the first metal layer for the wiring arrangement of the data lines, film thickness is reduced, along with formation of the gate electrodes and the source and drain electrodes through one mask process, which reduces number of processes and masks, improves production efficiency, increase a display aperture ratio, and enhances display performance.

The technical solutions of the present invention will now be described with reference to specific embodiments.

Figure 9A:
FIGS. 9A to 9E are a first type of schematic procedures of a method of manufacturing a display panel according to an embodiment of the present invention.

In this embodiment, the method of manufacturing the display panel 100 includes:

Step S100: providing the substrate 200, as shown in FIG. 9A.

In some embodiments, the substrate 200 may be a rigid substrate 200, such as a glass material, or may be a flexible substrate 200, such as polyimide.

Figure 9B:
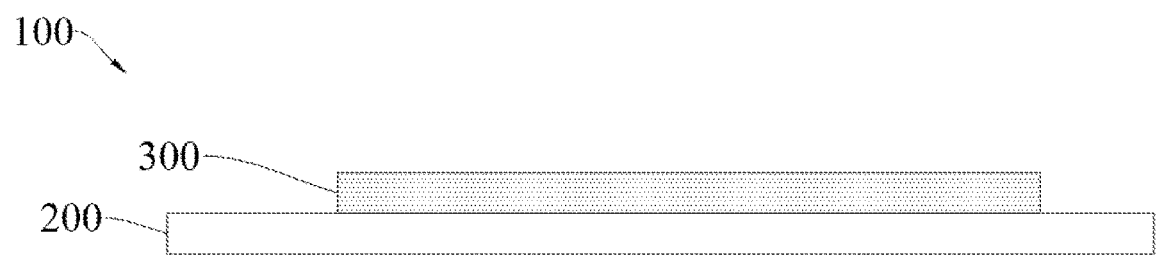

Step S200: forming the plurality of data lines 500 on the substrate 200 to form the first metal layer 300, as shown in FIG. 9B.

In some embodiments, step S200 includes:

Step S210: forming a buffer layer 210 on the substrate 200.

In some embodiments, step S210 includes: forming the buffer layer 210 including a plurality of third via holes 830 on the substrate 200.

Step S220: forming a first metal material layer on the buffer layer 210.

Step S230: patterning the first metal material layer to form the plurality of data lines 500 in order for formation of the first metal layer 300.

In some embodiments, the data lines 500 are arranged in a first direction.

In some embodiments, step S230 includes:

Step S231a: patterning the first metal material layer to form the plurality of data lines 500 and a plurality of light-shielding units 310 to form the first metal layer 300.

In some embodiments, the first metal layer 300 includes a plurality of light-shielding units 310 spaced apart from any of the data lines 500 and disposed in the same layer as the data lines 500, wherein an orthographic projection of the active layer 600 on the first metal layer 300 is located within a corresponding one of the light-shielding units 310.

The first metal layer 300 further includes a light-shielding unit 310 for shielding light directed to the active layer 600 to reduce photoelectric influence of the light on the active layer 600. Furthermore, the light-shielding unit 310 is spaced apart from any of the data lines 500 and is insulated from the data line 500 to reduce the influence of the data lines 500 on the signal of the light-shielding unit 310.

In some embodiments, step S230 includes:

Step S231b: patterning a first metal material layer to form the plurality of data lines 500, a plurality of light-shielding units 310, and a plurality of light-reflecting units to form the first metal layer 300.

In some embodiments, the first metal layer 300 further includes a light-reflecting unit located between adjacent ones of the data lines 500 and is spaced apart from any of the data lines 500.

When the display panel 100 is a self-luminous display panel 100, the light-reflecting unit can reflect light emitted in a direction from the first metal layer 300 away from the substrate 200 toward the first metal layer 300, so as to improve light extraction efficiency of the display panel 100.

Figure 9C:
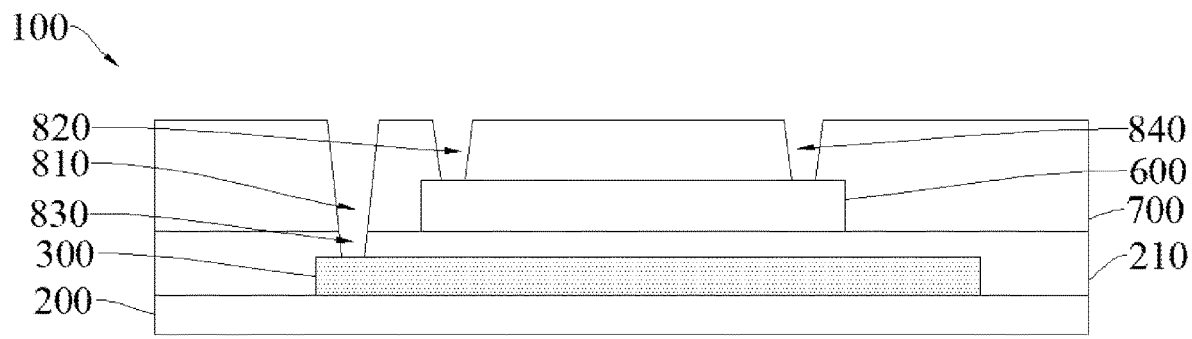

Step S300: forming an interlayer dielectric layer 700 including a plurality of first via holes 810 on a side of the data lines 500 away from the substrate 200, wherein the first via holes 810 expose the data line 500, as shown in FIG. 9C.

In some embodiments, each of the first via holes 810 is formed extending through a corresponding one of the third via holes 830, so that the data line 500 is exposed.

In some embodiments, step S300 includes:

Step S310: forming an active layer 600 on the side of the data line 500 away from the substrate 200.

In some embodiments, step S310 includes:

Step S311: forming an active material layer on the side of the data line 500 away from the substrate 200.

Step S312: doping the active material layer to form a channel region 610 close to a central region of the active material layer, a heavily doped region 630 away from the central region of the active material layer, and a lightly doped region 620 disposed between the channel region 610 and the heavily doped region 630.

In some embodiments, the active layer 600 includes the channel region 610, the heavily doped region 630, and the lightly doped region 620 disposed between the channel region 610 and the heavily doped region 630. Specifically, the gate electrode 410 is disposed corresponding to the channel region 610, the source electrode 421 is correspondingly connected to the heavily doped region 630 through the second via hole 820, and the drain electrode 422 is correspondingly connected to the heavily doped region 630 through the fourth via hole 840.

Step S320: forming the interlayer dielectric layer 700 including the plurality of first via holes 810, a plurality of the second via holes 820, and a plurality of fourth via holes 840 on the side of the active layer 600 away from the substrate 200, so that the first via holes 810 expose the data lines 500, and the second via holes 820 and the fourth via holes 840 expose the active layer 600.

In some embodiments, the display panel 100 further includes the active layer 600 located between the second metal layer 400 and the first metal layer 300, wherein an orthographic projection of any one of the data lines 500 on the substrate 200 is located outside an orthographic projection of the active layer 600 on the substrate 200.

Figure 9D:
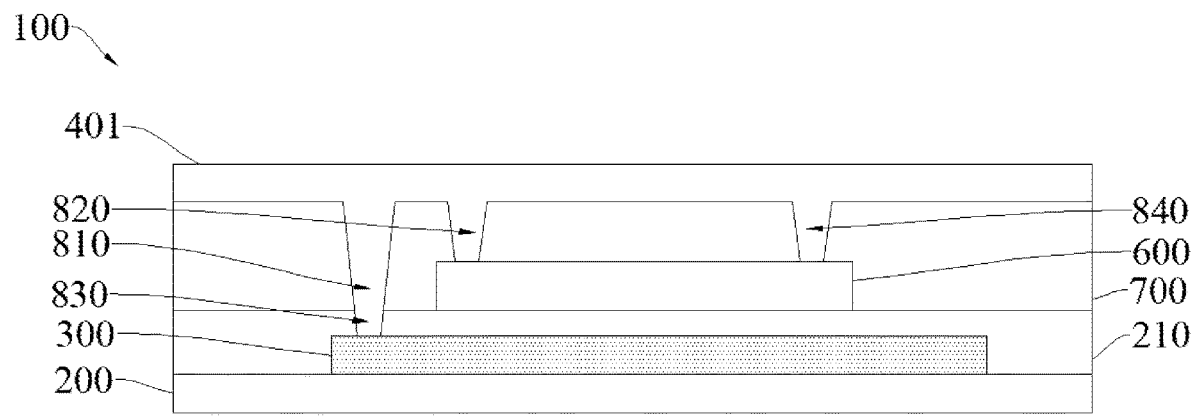

Step S400: forming the second metal material layer 401 on the side of the interlayer dielectric layer 700 away from the data lines 500, as shown FIG. 9D.

In some embodiments, the first metal layer and the second metal layer may be a single metal layer or a stacked metal layer, which is not specifically limited herein.

Figure 9E:
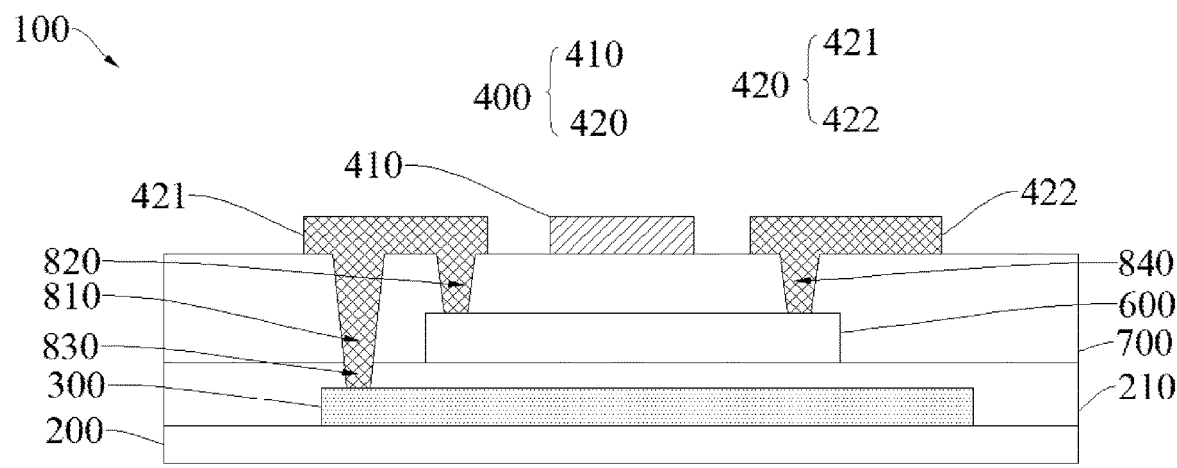

Step S500: patterning the second metal material layer 401 to form the plurality of gate electrodes 410 and the plurality of sets of source and drain electrodes 420 to form the second metal layer 400, wherein the source and drain electrodes 420 are electrically connected to the data lines 500 through the first via holes 810, as shown in FIG. 9E.

In some embodiments, step S500 includes:

Step S510: patterning the second metal material layer 401 to form the gate electrodes 410 and the plurality of sets of source and drain electrodes 420 to form the second metal layer 400. The source and drain electrodes 420 are electrically connected to the data line 500 through the first via hole 810, and the source and drain electrodes 420 are electrically connected to the active layer 600 through the second via hole 820 and the fourth via hole 840.

In some embodiments, the display panel 100 further includes a buffer layer 210 located between the active layer 600 and the first metal layer 300, and an interlayer dielectric layer 700 located between the active layer 600 and the second metal layer 400. The interlayer dielectric layer 700 includes a plurality of first via holes 810 and a plurality of second via holes 820, the buffer layer 210 includes a plurality of third via holes 830, and each set of the source and drain electrodes 420 includes a source electrode 421 and a drain electrode 422 arranged opposite to each other. Each of the first via holes 810 is formed extending through a corresponding one of the third via holes 830, the source electrode 421 is electrically connected to the data line 500 through the first via hole 810 and the third via hole 830, and the source electrode 421 is electrically connected to the active layer 600 through the second via hole 820. Specifically, an extending direction of a connection line defined between the first via hole 810 and the second via hole 820 corresponding to a same source electrode 421 is parallel to an extending direction of the data line 500.

In some embodiments, each of the data lines 500 includes a first segment 510 and a second segment 520 located parallel to each other. Specifically, an orthographic projection of the active layer 600 on the first metal layer 300 is located on an extending line of the first segment 510 and is positioned outside an extending line of the second segment 520, and the source electrode 421 is electrically connected to a corresponding one of the first segments 510.

In some embodiments, the data line 500 further includes a third segment 530 connecting the first segment 510 and the second segment 520, and a fourth segment 540 parallel to the first segment 510, and a fifth segment 550 connecting the second segment 520 and the fourth segment 540. The third segment 530 may be perpendicular to the first segment 510, and the fifth segment 550 may be perpendicular to the fourth segment 540.

In some embodiments, the method of manufacturing the display panel 100 further includes:

Step S600: forming a planarization layer 220 including a plurality of fifth via holes 850 on the side of the second metal layer 400 away from the substrate 200.

Step S700: forming a pixel electrode layer 230 on the side of the planarization layer 220 away from the substrate 200.

In some embodiments, the interlayer dielectric layer 700 further includes a plurality of fourth via holes 840, and the drain electrode 422 is electrically connected to the active layer 600 through the fourth via hole 840. The display panel 100 further includes a pixel electrode layer 230 located on a side of the second metal layer 400 away from the substrate 200, and a planarization layer 220 located between the pixel electrode layer 230 and the second metal layer 400. Specifically, the planarization layer 220 includes a plurality of fifth via holes 850, and the pixel electrode layer 230 is electrically connected to the drain electrodes 422 through the fifth via holes 850.

In this invention, by disposing the gate electrodes and the source and drain electrodes in the same layer, and the data lines and the first metal layer in the same layer, and by using the first metal layer for the wiring arrangement of the data lines, film thickness is reduced, along with formation of the gate electrodes and the source and drain electrodes through one mask process, which reduces number of processes and masks, improves production efficiency, increase a display aperture ratio, and enhances display performance.

Figure 10:
FIG. 10 is a schematic structural view of a display device according to an embodiment of the present invention.

Referring to FIG. 10, an embodiment of the present invention further provides a display device 10, including the display panel 100 and the device body 20 as described above. The device body 20 and the display panel are integrally assembled.

For the specific structure of the display panel 100, please refer to any of the above-mentioned embodiments of the display panel 100 and the accompanying drawings, which will not be repeated here.

In this embodiment, the device body 20 may include a middle frame, a sealant, etc., and the display device 10 may be a display terminal, such as a mobile phone, a tablet, or a television, which is not limited herein.

In some embodiments, the display device 10 further includes a plurality of optical devices, which may be one or a combination of a camera, a distance sensor, a fingerprint identification device, or an infrared sensor combination.

The embodiments of the present invention disclose a display panel and a display device. The display panel includes a substrate, a first metal layer located on a side of the substrate, and a second metal layer located on a side of the first metal layer away from the substrate. The second metal layer includes a plurality of gate electrodes and a plurality of sets of source and drain electrodes arranged in the same layer as the gate electrodes, wherein the display panel further includes a plurality of data lines, and any one of the data lines is arranged in the same layer as the first metal layer and is electrically connected to the source and drain electrodes. In the present invention, by disposing the gate electrodes and the source and drain electrodes in the same layer, and the data lines and the first metal layer in the same layer, and by using the first metal layer for a wiring arrangement of the data lines, film thickness is reduced, along with formation of the gate electrodes and the source and drain electrodes through one mask process, which reduces number of processes and masks, improves production efficiency, increase a display aperture ratio, and enhances display performance.

It can be understood that for those of ordinary skill in the art, equivalent substitutions or changes can be made according to the technical solution and inventive concept of the present application, and all these changes or substitutions should fall within the protection scope of the appended claims of the present application.

What is claimed is:

1. A display panel, comprising:
   a substrate;
   a first metal layer disposed on a side of the substrate;
   a second metal layer disposed on a side of the first metal layer away from the substrate and comprising a plurality of gate electrodes and a plurality of sets of source and drain electrodes arranged in the same layer as the gate electrodes;
   an active layer located between the first metal layer and the second metal layer;
   a buffer layer located between the first metal layer and the active layer;

an interlayer dielectric layer located between the buffer layer and the second metal layer metal layer; and
a plurality of data lines, wherein each of the data lines is disposed in the same layer as the first metal layer and is electrically connected to the source and drain electrodes;
wherein the interlayer dielectric layer comprises a plurality of first via holes and a plurality of second via holes, the buffer layer comprises a plurality of third via holes, and each set of the source and drain electrodes comprising the source electrode disposed opposite to the drain electrode, wherein each of the first via holes is located extending through a corresponding one of the third via holes, each of the source electrodes is electrically connected to the data line through the first via hole and the third via hole, and the source electrode is electrically connected to the active layer through the second via hole; and wherein an extending direction of a connection line defined between the first via hole and the second via hole corresponding to a same source electrode is parallel to an extending direction of the data line.

2. The display panel of claim 1, further comprising an active layer located between the second metal layer and the first metal layer;
wherein an orthographic projection of each of the data lines on the substrate is located outside an orthographic projection of the active layer on the substrate.

3. The display panel of claim 2, wherein each of the data lines comprises a first segment and a second segment located parallel to each other;
wherein an orthographic projection of the active layer on the first metal layer is located on an extending line of the first segment and is positioned outside an extending line of the second segment, and the source electrode is electrically connected to a corresponding one of the first segments.

4. The display panel of claim 3, wherein each of the data lines further comprises a third segment connecting the first segment and the second segment, a fourth segment parallel to the first segment, and a fifth segment connecting the second segment and the fourth segment; and wherein the third segment is perpendicular to the first segment, and the fifth segment is perpendicular to the fourth segment.

5. The display panel of claim 2, wherein the interlayer dielectric layer further comprises a plurality of fourth via holes, and the drain electrodes are electrically connected to the active layer through the fourth via holes;
wherein the display panel further comprises a pixel electrode layer located on a side of the second metal layer away from the substrate, and a planarization layer located between the pixel electrode layer and the second metal layer;
wherein the planarization layer comprises a plurality of fifth via holes, and the pixel electrode layer is electrically connected to the drain electrodes through the fifth via holes.

6. The display panel of claim 5, wherein the active layer comprises a channel region, a heavily doped region, and a lightly doped region disposed between the channel region and the heavily doped region;
wherein the gate electrode is disposed corresponding to the channel region, the source electrode is correspondingly connected to the heavily doped region through the second via hole, and the drain electrode is correspondingly connected to the heavily doped region through the fourth via hole.

7. The display panel of claim 5, wherein an orthographic projection of the fifth via hole on the substrate is located within an orthographic projection of the drain electrode on the substrate, and the orthographic projection of the fifth hole on the substrate is located outside the orthographic projection of the active layer on the substrate.

8. The display panel of claim 2, wherein the first metal layer comprises a plurality of light-shielding units spaced apart from any one of the data lines and disposed in the same layer as the data lines;
wherein an orthographic projection of the active layer on the first metal layer is located within a corresponding one of the light-shielding units.

9. The display panel of claim 1, wherein the second metal layer further comprises a plurality of scan lines arranged in a first direction;
wherein any one of the data lines is arranged in a second direction, and the first direction is perpendicular to the second direction.

10. The display panel of claim 1, wherein the first metal layer further comprises a light-reflecting unit located between adjacent ones of the data lines and is spaced apart from any one of the data lines.

11. A display device, comprising a display panel and a device body assembled together into one body, wherein the display panel comprises:
a substrate;
a first metal layer disposed on a side of the substrate;
a second metal layer disposed on a side of the first metal layer away from the substrate and comprising a plurality of gate electrodes and a plurality of sets of source and drain electrodes arranged in the same layer as the gate electrodes;
an active layer located between the first metal layer and the second metal layer;
a buffer layer located between the first metal layer and the active layer;
an interlayer dielectric layer located between the buffer layer and the second metal layer metal layer; and
a plurality of data lines, wherein each of the data lines is disposed in the same layer as the first metal layer and is electrically connected to the source and drain electrodes;
wherein the interlayer dielectric layer comprises a plurality of first via holes and a plurality of second via holes, the buffer layer comprises a plurality of third via holes, and each set of the source and drain electrodes comprising the source electrode disposed opposite to the drain electrode, wherein each of the first via holes is located extending through a corresponding one of the third via holes, each of the source electrodes is electrically connected to the data line through the first via hole and the third via hole, and the source electrode is electrically connected to the active layer through the second via hole; and wherein an extending direction of a connection line defined between the first via hole and the second via hole corresponding to a same source electrode is parallel to an extending direction of the data line.

12. The display device of claim 11, wherein the display panel further comprises an active layer located between the second metal layer and the first metal layer;
wherein an orthographic projection of each of the data lines on the substrate is located outside an orthographic projection of the active layer on the substrate.

13. The display device of claim 12, wherein each of the data lines comprises a first segment and a second segment located parallel to each other;
 wherein an orthographic projection of the active layer on the first metal layer is located on an extending line of the first segment and is positioned outside an extending line of the second segment, and the source electrode is electrically connected to a corresponding one of the first segments.

14. The display device of claim 13, wherein each of the data lines further comprises a third segment connecting the first segment and the second segment, a fourth segment parallel to the first segment, and a fifth segment connecting the second segment and the fourth segment; and wherein the third segment is perpendicular to the first segment, and the fifth segment is perpendicular to the fourth segment.

15. The display device of claim 12, wherein the interlayer dielectric layer further comprises a plurality of fourth via holes, and the drain electrodes are electrically connected to the active layer through the fourth via holes;
 wherein the display panel further comprises a pixel electrode layer located on a side of the second metal layer away from the substrate, and a planarization layer located between the pixel electrode layer and the second metal layer;
 wherein the planarization layer comprises a plurality of fifth via holes, and the pixel electrode layer is electrically connected to the drain electrodes through the fifth via holes.

16. The display device of claim 15, wherein the active layer comprises a channel region, a heavily doped region, and a lightly doped region disposed between the channel region and the heavily doped region;
 wherein the gate electrode is disposed corresponding to the channel region, the source electrode is correspondingly connected to the heavily doped region through the second via hole, and the drain electrode is correspondingly connected to the heavily doped region through the fourth via hole.

17. The display device of claim 15, wherein an orthographic projection of the fifth via hole on the substrate is located within an orthographic projection of the drain electrode on the substrate, and the orthographic projection of the fifth hole on the substrate is located outside the orthographic projection of the active layer on the substrate.

18. The display device of claim 12, wherein the first metal layer comprises a plurality of light-shielding units spaced apart from any one of the data lines and disposed in the same layer as the data lines;
 wherein an orthographic projection of the active layer on the first metal layer is located within a corresponding one of the light-shielding units.

19. The display device of claim 11, wherein the second metal layer further comprises a plurality of scan lines arranged in a first direction;
 wherein any one of the data lines is arranged in a second direction, and the first direction is perpendicular to the second direction.

20. The display device of claim 11, wherein the first metal layer further comprises a light-reflecting unit located between adjacent ones of the data lines and is spaced apart from any one of the data lines.

* * * * *